United States Patent [19]

Tanimoto et al.

[11] Patent Number: 4,769,523
[45] Date of Patent: Sep. 6, 1988

[54] LASER PROCESSING APPARATUS

[75] Inventors: Akikazu Tanimoto, Yokohama; Keiichiro Sakato; Joji Iwamoto, both of Kawasaki; Hiroshi Shirasu, Yokohama; Kiyoto Mashima, Kawasaki, all of Japan

[73] Assignee: Nippon Kogaku K.K., Tokyo, Japan

[21] Appl. No.: 4,265

[22] Filed: Jan. 9, 1987

Related U.S. Application Data

[63] Continuation of Ser. No. 837,525, Mar. 7, 1986, abandoned.

[30] Foreign Application Priority Data

Mar. 8, 1985 [JP] Japan ................................. 60-44900
Mar. 27, 1985 [JP] Japan ................................. 60-62964
Apr. 2, 1985 [JP] Japan ................................. 60-68535

[51] Int. Cl.$^4$ ............................................. B23K 26/00
[52] U.S. Cl. ............................. 219/121.6; 219/121.62; 219/121.76; 219/121.82; 219/121.83; 356/400; 356/401
[58] Field of Search ..... 219/121 L, 121 LM, 121 LC, 219/121 LN, 121 LH, 121 LJ, 121 LS, 121 LR, 121 LB, 121 LZ, 121 LY; 356/400, 401

[56] References Cited

U.S. PATENT DOCUMENTS

| | | | |
|---|---|---|---|
| 4,371,264 | 2/1983 | Lacombat et al. | 356/400 |
| 4,402,610 | 9/1983 | Lacombat | 356/400 |
| 4,566,795 | 1/1986 | Matsuura et al. | 356/401 |
| 4,573,791 | 3/1986 | Phillips | 356/401 X |
| 4,577,958 | 3/1986 | Phillips | 356/401 X |

Primary Examiner—C. L. Albritton
Attorney, Agent, or Firm—Michael N. Meller

[57] ABSTRACT

A laser processing apparatus for projecting a spot of laser beam onto a portion of a microcircuit pattern on a semiconductor wafer, photographic mask or the like to cut the lead or anneal the limited area. The laser processing apparatus includes a mark detector for detecting the positions of first marks preliminarily provided on a work as the relative positions to the detection centers of the mark detector itself, a controller for controlling a processing energy beam generator so as to form on the work second marks detectable by the mark detector, and an error detector responsive to the results of the position detection of the second marks by the mark detector so as to detect relative positional errors between the focussing centers of the energy beam on the work and the detection centers of the mark detector.

23 Claims, 13 Drawing Sheets

LASER PROCESSING APPARATUS

This application is a continuation of application Ser. No. 837,525, filed 3/7/86, abandoned.

BACKGROUND OF THE INVENTION

1. Field of the Invention

The present invention relates to a pattern processing apparatus for processing circuit patterns such as ICs or VLSICs formed on a semiconductor wafer, photographic mask or reticle and more particularly to a laser processing apparatus for projecting a spot of laser beam on a portion of a circuit pattern to cut the lead or anneal the selected area.

2. Description of the Prior Art

With the recent remarkable advance in increasing the circuit density and fineness of semiconductor devices, mass production techniques have been rapidly developed for the fabrication of semiconductor memories (e.g., RAMs and ROMs) each having a memory capacity of 1 megabits, 4 megabit or as large as 16 megabits, within a chip which is several millimeters square. Generally, semiconductor devices are formed on a circular semiconductor wafer by means of a lithographic process. With conventional conductor devices not so high in circuit density, e.g., semiconductor memories and the like, it has been the usual practice that after semiconductor devices (hereinafter referred to as chips) have been formed on a wafer, the chips are cut off or separated from each other by a wafer scriber and are placed in appropriate packages. In the case of memories having greater capacities and devices whose line width is the circuitry is reduced to 1 $\mu$m, however, there has been an increasing need for inspecting the chips formed on a wafer by the use of a wafer prober and a tester as to whether the individual chips properly function electrically. By so inspecting, it is possible to prevent deterioration of the productivity due to the chips being judged as reject chips after their packaging.

Then, manufacturing techniques of the presently available higher-density chips include one which is referred to as a redundancy process. This process performs the processing in the following manner. For instance, while essentially a semiconductor memory is only required to have a given number of memory cells, e.g., 1 megabits, or 4 megabit, spare cells or redundant cells (redundant circuits) are preliminarily prepared within the same chip during the manufacture in consideration of the possibility that only a part of the cells becomes defective. Then, if any defective portions are detected as a result of the inspection by the wafer prober, the spare cells are interconnected in place of the reject cells and the reject chip is saved.

This interconnection of the spare cells in the redundancy process is performed by projecting a condensed spot (several $\mu$m) of laser beam and cutting the special leads (which are generally called fuses and often made of a material such as polysilicone) or projecting the spot to the high-resistance interconnect layers and converting them to low-resistance interconnect layers. This type of apparatus employing a laser beam for the processing of articles is known as a so-called laser processing apparatus and it has also been used in the past as a laser trimming for adjusting the resistance value of resistors with a high degree of accuracy. Then, where the interconnection lines within any chip on a wafer are to be processed, it is essential to accurately project a laser beam to the interconnection line at any position on the wafer and a high degree of accuracy of about 0.3 $\mu$m is for example required. Therefore, a laser processing apparatus designed to perform the redundancy process is usually provided with an alignment optical system for aligning the laser spot with such high accuracy.

With this type of laser processing apparatus, however, its component parts suffer aging during a long period of use, thus causing a so-called drifting phenomena in which there occurs a difference between the working position detected by the alignment optical system and the actual working position by the laser beam projected through the projection lens as will be described hereunder.

In other words, the relative positional relation between the projection lens and the alignment optical system is essentially constant and not changing and the detection of a working center is effected on this premise. However, this relative positional relation is subject to variation due to the aging of the component parts as mentioned previously. Thus, there is a disadvantage that even if the processing is effected by arranging the projection lens opposite to the working center detected by the alignment optical system, the working center of the laser beam fails to coincide with the desired working center and the working position is shifted.

A similar disadvantage is caused when the chip itself on the wafer is deformed by the lithographic operation. Such deformation that can be caused by the lithographic operation is generally referred to as lithographic deformation and it often is a distortion peculiar to the exposure apparatus used in the exposure operation of the chips.

The presently available exposure apparatus are mainly divided into three types, i.e., optical type, X-ray type and electron (valence electron) type and the optical-type exposure apparatus are classified into a batch exposure type, slit scan type and projection type. In the case of these optical-type exposure apparatus, when the light image of a circuit pattern on a mask or reticle is projected onto a wafer, there exists more or less an optical distortion, e.g., a distortion of the image due to the aberration of the projection optical system or a run-out error due to an error in the projection magnification. On the other hand, the X-ray exposure apparatus are mainly of the proximity type and thus there is the danger of causing a deformation resulting in a small difference in size between the printed pattern and the pattern on the mask depending on the setting accuracy of a gap between the mask and the wafer.

Also, in the case of the electron-beam exposure apparatus, there is the danger of deforming a printed pattern with respect to a design pattern due to, for example, the aberration of the electron lens for deflecting the electron beam.

Such a lithographic distortion may also be caused by factors other than the exposure apparatus, i.e., the various treatments performed in the course of the wafer processing. During the wafer processing, the wafer is sometimes heated and this causes the occurrence of a run-out in the wafer on the whole. The occurrence of a run-out in the wafer results in a delicate deviation of the chip array on the wafer from the design values. This deviation is more manifest in the chips near the marginal portion of the wafer and the amount of deviation of the chip$ increases with increase in the size or the diameter of the wafer. The deviations of the chips due to the occurrence of a run-out in the wafer is considered to consist of their offsets in the x and y directions with respect to the design chip array and they can hardly take the form of deformations tending to change the form of the chips themselves. In any events, there is a disadvantage that since the chips on the wafer involve such lithographic deformations as those caused by the exposure apparatus and the processing operations, a processing reject is caused if the amount of such lithographic deformation approaches the spot size of the laser processing apparatus.

Also, one method of preventing any error due to such lithographic deformation is to preliminarily measure the accurate position of each fuse by projecting the attenuated processing laser beam on each fuse and detecting the resulting diffracted light or the scattered light. However, this method gives rise to another disadvantage of considerably deteriorating the throughput due to the need to measure the position of each fuse. Moreover, in this method the processing laser beam, though attenuated, is projected on some portions of the circuits in the chip and thus there is the danger of causing serious damages to the circuit pattern of the CMOS structure, for example.

SUMMARY OF THE INVENTION

It is an object of the present invention to provide a laser processing apparatus capable of making the alignment of a laser projection point with a high degree of accuracy.

It is another object of the invention to provide an apparatus capable of eliminating any deviation of a working position due to a drifting factor and detecting the working position with ease and greater accuracy in a processing apparatus employing an energy beam.

It is still another object of the invention to provide a pattern processing apparatus capable of processing the chips on a substrate which involve lithographic deformations.

DESCRIPTION OF THE PREFERRED EMBODIMENTS

Figure 1:
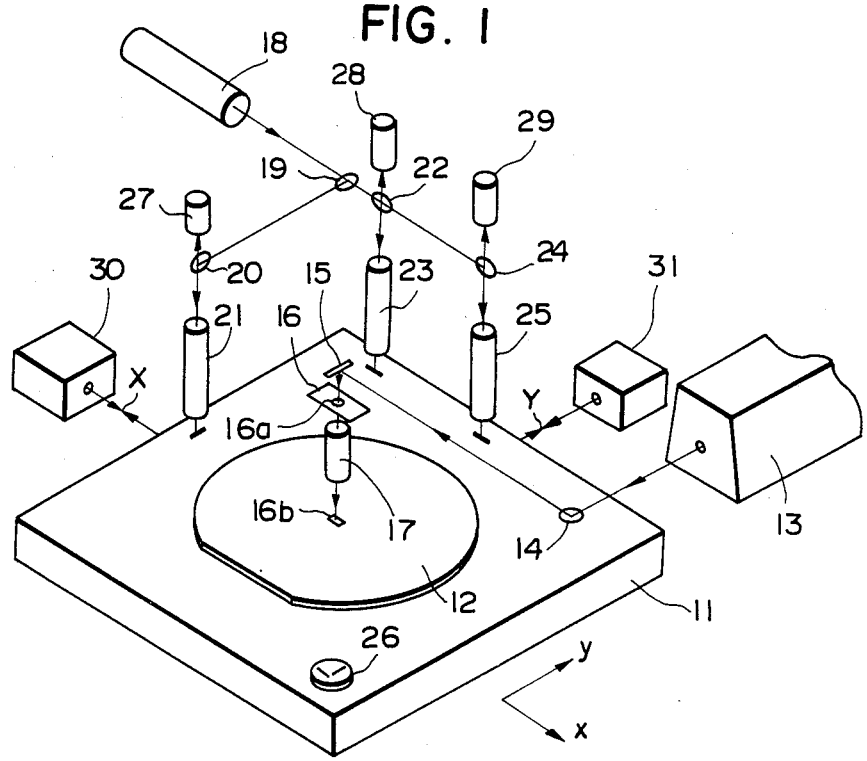
FIG. 1 is a perspective view of a laser processing apparatus according to a first embodiment of the invention.

A first embodiment of the invention capable of accurate processing despite a drift phenomenon will be described first with reference to FIG. 1. In the Figure, though not shown, a $\theta$-stage chucking a wafer 12 and adapted to make small rotary movements is mounted an XY stage 11. A processing laser pulse oscillator 13 emits an ND-YAG laser beam. An aperture plate 16 is designed to change the size of a variable aperture 16a by means of its plurality of blades. A projection lens 17 forms on the wafer 12 a projected image 16b (of a size less than several $\mu$m square) of the aperture 16a by the laser beam. An alignment optical system includes an alignment laser oscillator 18, half-mirrors 19, 20, 22, X-, $\theta$- and Y- direction alignment microscopes 21, 23 and 25 and photodetectors 27, 28 and 29. A fiducial mark 26 is formed in the same pattern as the alignment marks on the wafer 12, which will be described later. Laser interferometers 30 and 31 are provided to measure the position of the stage 11 in the x and y directions, respectively.

The processing laser beam emitted from the oscillator 13 is reflected first by mirrors 14 and 15, condensed by the projection lens 17 through the aperture 16a of the aperture plate 16 and projected onto the wafer 12 to form a rectangular image thereon, thereby performing the desired processing operation. The stage 11 carrying thereon the work or wafer 12 is moved in the x and y directions by their drivers (not shown) and its position is measured by the interferometers 30 and 31 to control it.

When performing the processing by the processing beam, it is necessary to grasp the relative positions of the projection lens 17, the alignment microscopes 21, 23 and 25 and the stage 11.

Figure 2:
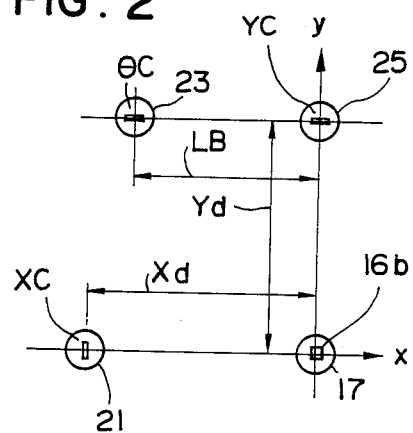
FIG. 2 is a diagram showing the positional relation between the projection lens and the alignment optical system.

In FIG. 2 showing their relative positions, the detection center XC of the alignment microscope 21 corresponds to the center of small oscillation of the beam spot in the x direction and the detection centers $\theta$C and YC of the alignment microscopes 23 and 25 correspond to the center of small oscillation of the beam spot in the y direction. Their center distances are respectively represented as Yd, Xd and LB in the Figure.

Figure 3:
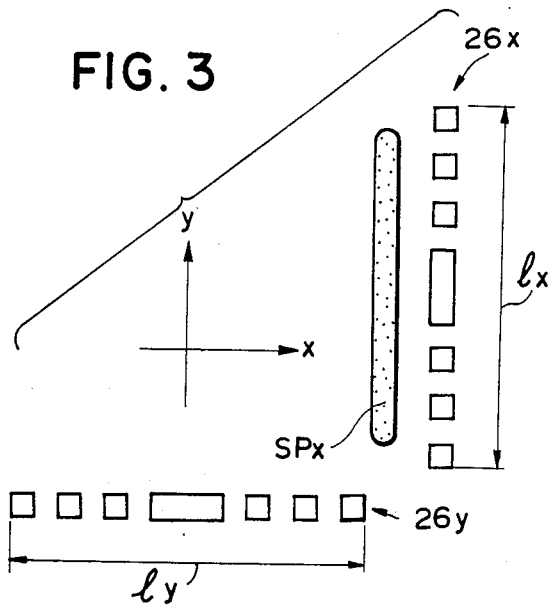
FIG. 3 is a plan view showing the relation between the fiducial mark and the x-alignment beam spot.

The fiducial mark 26 provided on the stage 11 comprises marks 26x and marks 26y in the form of diffraction gratings consisting of segments arranged along straight lines extended over distances lx and ly in the x and y directions, respectively, as shown in FIG. 3. The fiducial mark 26 is mainly used for the purpose of measuring the distances Yd and Xd shown in FIG. 2. In other words, the laser beam emitted from the laser oscillator 18 is branched into three directions by the half-mirrors 19, 20, 22 and 24, whereby the stage 11 is moved to illuminate the fiducial mark 26 through the alignment microscopes 21, 23 and 25 and the resulting diffracted light from the marks are detected by the photodetectors 27, 28 and 29, thereby measuring the relative distances of the alignment microscopes. In Fig. 3, symbol SPx indicates the relation between the spot Xc of the alignment microscope 21 and the fiducial mark 26. In addition the mark 26 is used for measuring the parallelism of the beam spots $\theta$c and Yc with respect to the X-axis.

Also, it is necessary to grasp the relative positions of the wafer 12 and the alignment microscopes 21, 23 and 25 and they are measured in the following manner.

Figure 4:
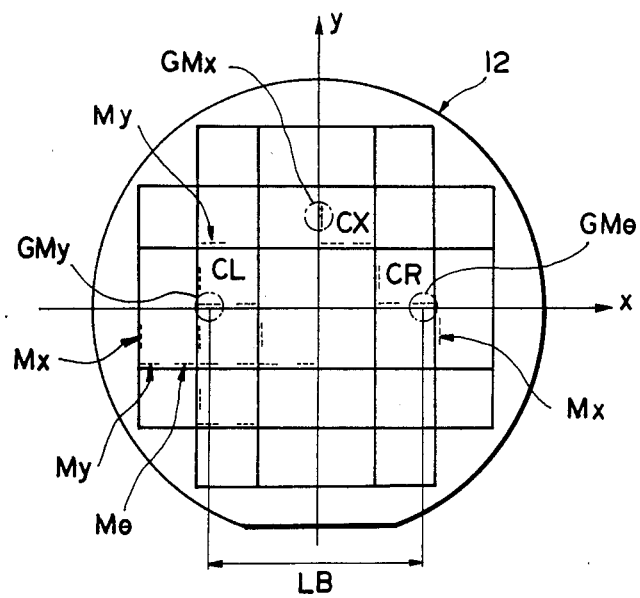
FIG. 4 is a plan view of the wafer.

The wafer 12 includes a plurality of chips formed in the form of a matrix as shown in FIG. 4. Alignment marks Mx, My and M$\theta$ are provided for some or all of the chips and the distance between the marks GMy and GM$\theta$ attached to the left and right chips CL and CR in substantially the central row is selected equal to the distance LB. This distance is equal to the distance between the alignment microscopes 23 and 25. The marks GMy and GM$\theta$ are simultaneously detected by the alignment microscopes 23 and 25, respectively, and a rotation error of the wafer 12 is detected. Then, a position adjustment is effected by the $\theta$ stage. In accordance with the above detection, the alignment of the wafer 12 in the y direction is also effected. On the other hand, the mark GMx attached to the chip CX near the y-axis is detected by the alignment microscope 21 and the wafer 12 is aligned in the x direction. In other words, the calibration of the array coordinates on the wafer 12 and the x-y moving coordinates of the stage 11 is effected. It is to be noted that where the lithographic process or printing is effected by an exposure apparatus of the step-and-repeat type, the marks Mx, My and M$\theta$ are provided for each of the chips.

When the relative positions of the projection lens 17, the alignment microscopes 21, 23 and 25, the stage 11 and the wafer 12 have been grasped as above mentioned, it is possible to move the stage 11 in accordance with the coordinates of the chip to be processed and thereby bring the projection lens 17 above the chip to be processed. It is to be noted that the position of the projection lens 17 is measured by methods such that, for example, the intensity of the processing laser beam is reduced by means of an attenuator (not shown) so as to illuminate the fiducial mark or the marks on the wafer and thereby detect the resulting scattered light or alternatively the variable aperture 16a of the aperture plate 16 is illuminated by the light from a separate light source, thereby detecting the resulting reflected light.

Figure 5:
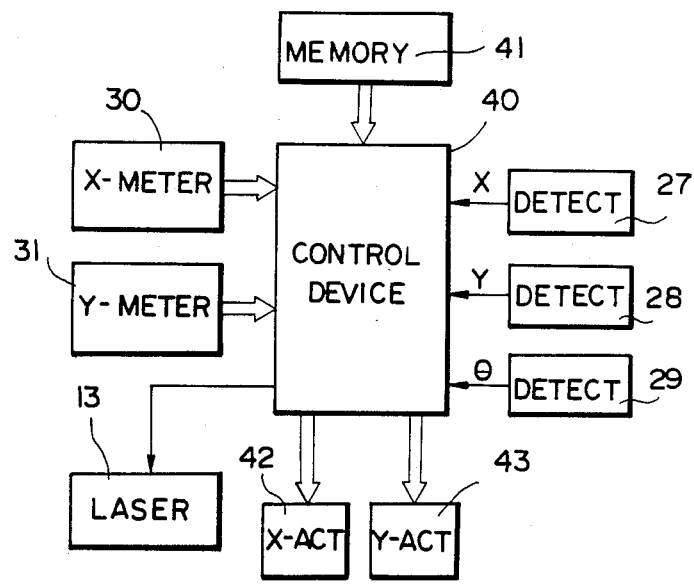
FIG. 5 is a block diagram of the first embodiment.

FIG. 5 shows a control system for controlling the apparatus of FIG. 1.

The operation of the first embodiment will now be described with reference to FIGS. 5 to 7.

When effecting the laser processing, a global alignment (a step 1) of the wafer 12 is effected by utilizing the X-microscope 21, the Y-microscope 25 and the $\theta$-microscope 23 and then the positions of the alignment marks Mx and My on the wafer 12 are detected to determine the x-coordinate Xw of the mark Mx and the y-coordinate Yw of the mark My (a step 2).

Figure 6:
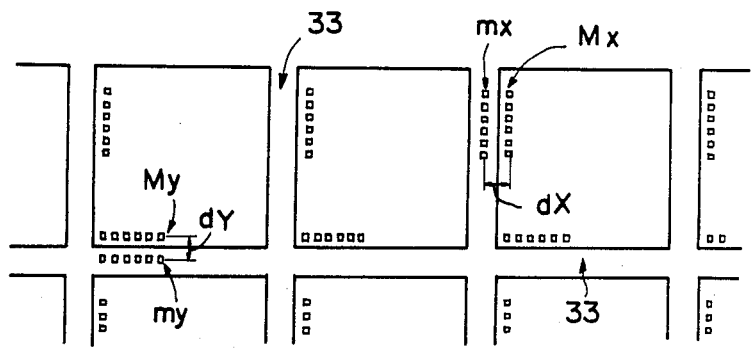
FIG. 6 is a diagram showing the alignment marks for the chips on the wafer and the dummy marks on the wafer grid.
Figure 7:
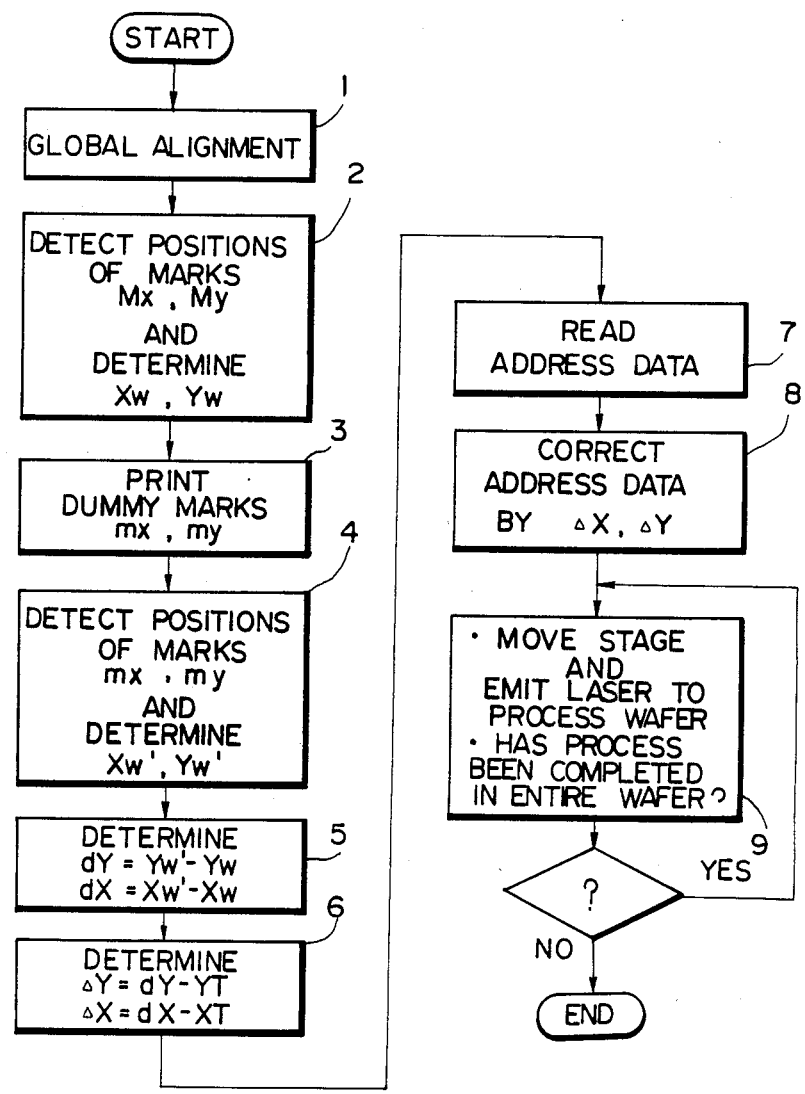
FIG. 7 is a flow chart showing the operation of the first embodiment.

Then, dummy marks mx and my are formed on the wafer grid 33 formed between the chips on the wafer 12 by using the processing laser beam as shown in FIG. 6 (a step 3). The dummy marks mx and my are of the same pattern as the alignment marks Mx and My. Also, the position of the dummy mark mx is apart from the alignment mark Mx by a distance $X_T$ in the x direction and the position of the dummy mark my is apart from the alignment mark My by a distance $Y_T$ in the y direction. These positions are determined by positioning the stage 11 by the interferometers 30 and 31 on the basis of the structural center of the projection lens 17 and the distances Xd and Yd between this structural center and the centers of the alignment microscopes 21 and 25.

Then, the positions of the dummy marks mx and my are respectively detected by the microscopes 21 and 25 through the interferometers 30 and 31, thereby determining their x- and y-coordinates Xw' and Yw' (a step 4). The distance dX between the dummy mark mx and the alignment mark Mx and the distance dY between the marks my and My are given by the following equations (1) and the calculation of these distances dX and dY is performed by a control device 40 (a step 5).

$$dX = Xw' - Xw$$

$$dY = Yw' - Yw \qquad (1)$$

Then, since the dummy marks mx and my are formed by determining their positions on the basis of the structural center of the projection lens 17 in accordance with the distances Xd and Yd, considering the latter as being constant as mentioned previously, if a drift occurs so that the distances Xd and Yd are varied or the structural center of the projection lens 17 does not coincides with the center of the optical axis of the processing laser beam passing through the projection lens 17, the distances XT and YT between the dummy marks mx and my and the alignment marks Mx and My naturally deviate from the previously mentioned distances dX and dY. In other words, there occur errors $\Delta$X and $\Delta$Y due to the drifting factor as given by the following equations (2)

$$\Delta X = dX - XT$$

$$\Delta Y = dY - YT \qquad (2)$$

Thus, the control device 40 calculates the errors 6X and 6Y (a step 6).

Therefore, when moving the stage 11 so as to bring the projection lens 17 to the desired working position on the wafer 12, the amounts of movement are corrected by the errors $\Delta$X and $\Delta$Y so that the center of the processing laser beam passed through the projection lens 17 accurately coincides with the working position.

Then, the control device 40 reads from a memory 41 the stage positioning data (the predetermined design address data) relating to all the working positions within the chip to be processed on the wafer 12 (a step 7) and the address data are corrected by the previously determined errors $\Delta$X and $\Delta$Y, thereby producing a positioning map comprising the corrected address data (a step 8). Then, the control device 40 performs the desired addressing (positioning) of the stage 11 in accordance with the working position map corrected by the errors ΔX and ΔY so that the processing laser beam is emitted and the desired processing, e.g., cutting or annealing of the interconnection pattern, is effected (a step 9). Then, in accordance with the corrected position map, the control device 40 determines whether the whole processing has been completed so that if it has not, the addressing of the stage 11 and the processing are repeated again. In this way, all the processing of one wafer is completed.

Figure 8:
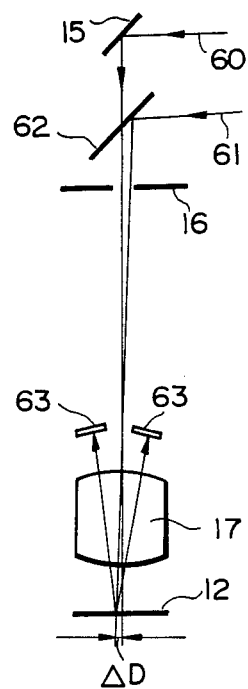
FIG. 8 is a schematic diagram showing the optical arrangement of a laser processing apparatus according to a modification of the first embodiment.

FIG. 8 shows a modification of the first emobidment which comprises a laser processing apparatus employing a dichroic mirror. In the Figure, elements 12, 15, 16 and 17 are the same as their counterpart components in the apparatus of FIG. 1. A mark detecting probe beam 61 reflected by a dichroic mirror 62 is projected onto the wafer 12 through the aperture plate 16 so that the scattered light or the diffracted light from the marks or the pattern edges on the wafer 12 is detected by scattered light detectors 63 and the corresponding working position is detected. If a processing laser beam 60 passed through the dichroic mirror 62 and the optical axis of the probe light 61 deviate from each other as shown in the Figure, the working position deviates by an amount ΔD and the processing position by the beam 60 produces an error corresponding to the amount ΔD from the detected position by the probe light 61.

In this case, after the marks on the wafer 12 have been detected by means of the probe beam 61 and the scattered light detectors 63, for example, by forming dummy marks at given distances from the marks on the wafer grid portions by the processing beam 60, detecting the positions of the dummy marks by means of the probe light 61, determining an error ΔD between the beam 60 and the optical axis of the probe beam 61 and providing a compensation corresponding to the error in the alignment of the working position as in the case of the first embodiment, it is possible to determine the working position accurately.

While, in the above-described embodiments, the YAG laser beam is used, the detection of the accurate working position as in these embodiments is possible in the case of a processing apparatus employing a pulsed laser such as an excima laser, an electron beam, or an ion beam in place of the YAG laser beam.

Figure 9:
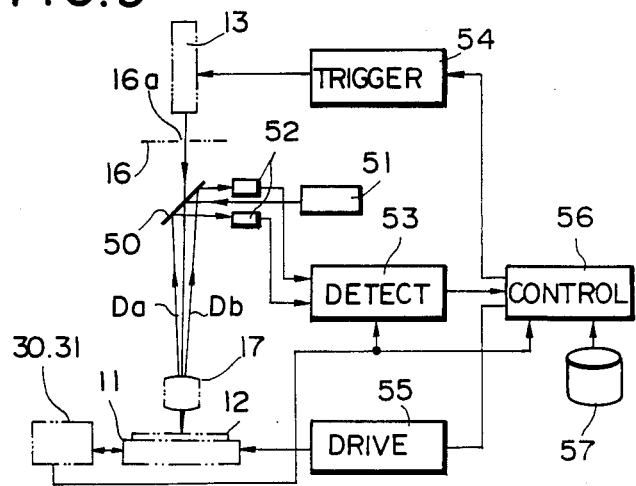
FIG. 9 is a schematic diagram showing the construction of an apparatus according to a second embodiment of the invention.

A second embodiment of the invention designed to correct an error in position due to a lithographic distortion or the like will now be described with reference to FIGS. 1 and 9. The apparatus of FIG. 9 is incorporated in the processing apparatus of FIG. 1. The laser beam from an He-Ne laser oscillator 51 is reflected by a half mirror 50, projected, along with the laser beam from the processing pulsed laser oscillator 13, to the projection lens 17 and then condensed to illuminate the wafer 12. When the beam impinges on the pattern, e.g., the stepped edge of the irregularities on the wafer 12, the beam is scattered. The resulting scattered light beams Da and Db are respectively detected by a pair of detectors 52 and the center of the position of the edge is detected by a detecting circuit 53 comprising an amplifier, an A/D converter, etc. The processing pulsed laser oscillator 13 emits a laser beam in response to a trigger signal applied from a trigger circuit 54. The XY stage 11 is moved by a drive cricuit 55. The trigger circuit 54 and the drive circuit 55 are controlled by a control unit 56 including a microcomputer. The distortion data of a pattern lithographer are preliminarily stored in a recording disc 57.

Figure 10:
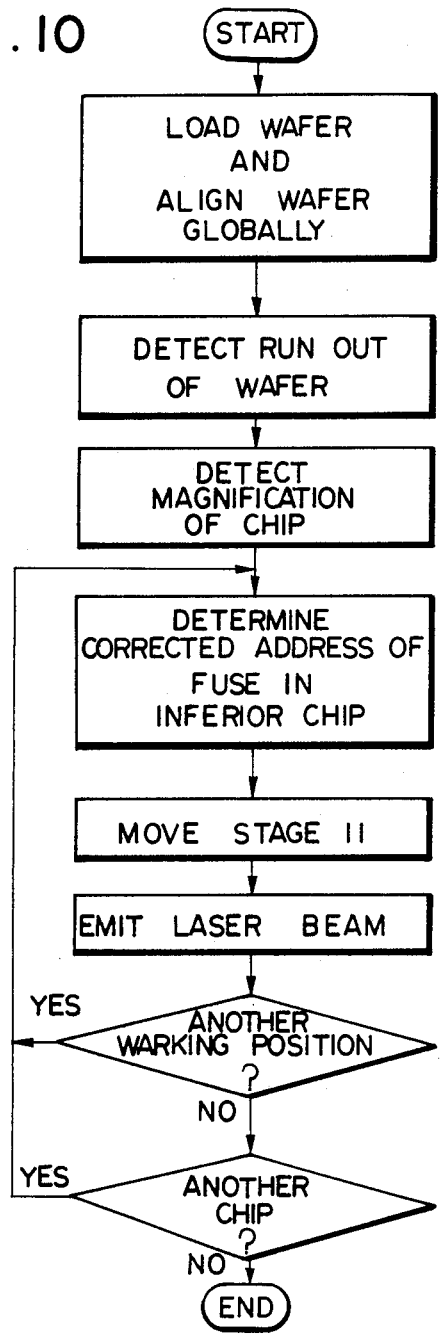
FIG. 10 is a flow chart showing the operation of the second embodiment.

Next, the operation of this embodiment will be described with reference to the flow chart of FIG. 10.

The wafer 12 is first loaded on the θstage (not shown) arranged on the XY stage 11 and the wafer 12 is aligned globally. In making this alignment, the marks GMy and GMθ (see Fig.4) on the wafer 12 are respectively detected by the alignment microscopes 23 and 25 and a rotation error of the wafer 12 is determined. Then, in accordance with this rotation error, the θ-stage is rotated and a position adjustment is effected. Simultaneously, the y-coordinate of the mark GMy is measured. Also, the x-coordinate of the mark GMx on the wafer 12 is detected by the alignment microscope 21. Thus, the x- and y-direction alignments are made by these detecting operations so that in response to these alignments the drive circuit 55 is operated and the position of the stage 11 is adjusted. At this time, the position of the stage 11 is measured by the interferometers 30 and 31.

Then, a run-out of the wafer 12 is measured. This measurement is performed by detecting the distance between the suitably selected marks Mx and the distance between the similar marks My in the x and y directions on the wafer 12 shown in FIG. 4 and comparing the detected distances with the design values, thereby determining the overall run-out of the wafer 12. This value includes the scaling error measurement of the wafer exposure apparatus. The scaling errors are the measurement errors of the laser interferometers. Then, the magnification of the chips is detected by a method which will be described later.

Figure 11:
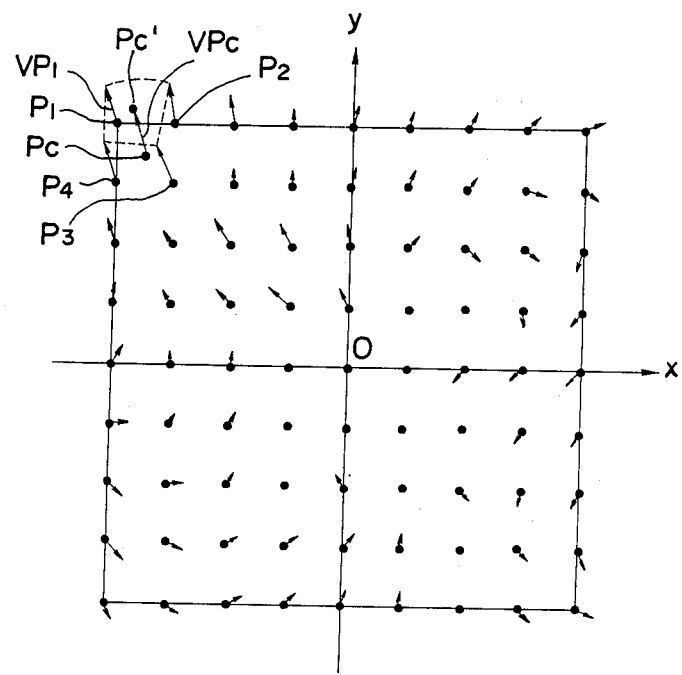
FIG. 11 is a diagram showing the deformation vectors of a distortion in a projected image field.

In this connection, FIG. 11 shows the distortion within the image field produced by one shot of the step-arid-repeat type exposure apparatus such as a reduction projection exposure apparatus. In the Figure, the one-shot field is divided in the form of a matrix and the deformation vector at each of the intersections is represented by an arrow. Now noting the leftmost upper cornor region, the deformation vectors at points $P_1$, $P_2$, $P_3$ and $P_4$ are respectively represented as $VP_1$, $VP_2$, $VP_3$ and $VP_4$. Thus, the object point which should lie at the point $P_1$ according to the design, is printed with an error corresponding to the vector $VP_1$. Also, the vector at the center Pc of the points $P_1$ to $P_4$ can be approximated as the average of the vectors $VP_1$ to $VP_4$ and it is represented as $VP_c$. In other words, in accordance with the design the object point near the point Pc is printed at a point Pc'. Such distortion information is preliminarily stored on the disc 57 of FIG. 9.

Figure 12:
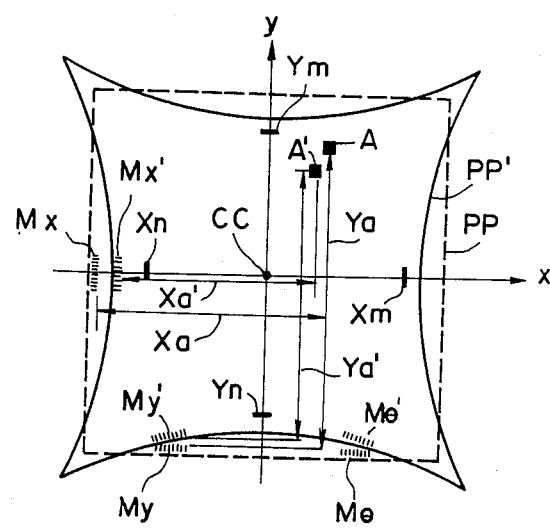
FIG. 12 is a diagram showing an exemplary distortion of the chip on a wafer.

FIG. 12 shows an exemplary distortion including both lens distortion and magnification errors. The actual pattern shape PP' is deformed as compared with the shape of a design pattern PP. Thus, the positions of the actual marks Mx', My' and Mθ' are inwardly displaced from the positions of the design marks Mx, My and Mθ. Marks Xm, Xn and Ym,Yn are respectiVely printed on the x and y axes. The marks Xm, Xn, Ym and Yn are printed inwardly of the marks Mx', My' and Mθ'. While a working position A is the position defined by Xa and Ya, the actual printed position A' is the position defined by Xa' and Ya'.

To effect a position correction due to such a deformation involving distortion and magnification errors, the distance between the marks Xm and Xn and the distance between the marks Ym and Yn are first measured.

The laser beam from the laser oscillator 51 and the detector 52 are utilized for this measurement.

In accordance with the measured values of the distance between the marks Xm and Xn and the distance between the marks Ym and Yn and their theoretical values, the lithographic magnification error of the chip is determined as follows:

$$\text{Lithography/magnification error} = \frac{\text{actual measured values of } Xm, Xn \text{ (or } Ym, Yn)}{\text{theoretical correction values of } Xm, Xn \text{ (or } Ym, Yn) \text{ for distortion}}$$

This lithography/magnification error may be measured by any separate means and inputted by input means such as a keyboard.

Then, corrected coordinates (address) of a portion to be processed, e.g., a fuse in an inferior chip, are calculated by the computer of the control unit 56. In making this calculation, the amount of deviation from the design position of the fuse in the inferior chip is first calculated on the basis of the lithography/magnification error and the lithography distortion data preliminarily stored in the computer. Then, with respect to the global alignment marks GMx and GMy, the amount of deviation from the predetermined value of the position in the chip including the marks is calculated in the like manner.

Then, in accordance with the data relating to the shape and arrangement of the chips, the data relating to the run-out of the wafer, the data relating to the fuse addresses corrected for the deviation and the global alignment marks and the distances Xd and Yd between the center of the projection lens 17 and the centers of the alignment microscopes 21 and 25, the absolute address (the corrected predetermined projection position) of the working position (fuse) is calculated.

At the next step, in accordance with the result of the above calculation the stage 11 is moved and positioned accurately. The desired amount of movement of the stage 11 is determined by the laser interferometers 30 and 31. After the positioning of the stage 11 has been completed, in response to a command from the control unit 56, the trigger circuit 54 drives the processing laser source 13 to oscillate so that the processing laser beam is projected onto the working position A' and a processing such as cutting or annealing of the interconnection pattern is effected.

Then, the control unit 56 determines whether the laser processing of all the fuses has been completed in accordance with the corrected data of the chip. If it has not, the next fuse is processed. When the processing of the chip has been completed, the control unit 56 determines whether the laser processing of all the inferior chips has been completed in accordance with the corrected data of the wafer. If it has not, the laser processing of the next inferior chip is performed.

While, in the above-described embodiments, the processing laser beam spot and the wafer are moved relative to each other by the stage 11, it is possible to arrange so that the chip-by-chip alignment is effected by the stage and the spot alignment within each chip is effected by the random scanning or raster scanning (deflection) of the beam. In this case, the correction of any chip arrangement error is effected by the stage 11 and the correction of the spot position due to a distortion of the chip itself is effected by correcting the driving timing of the processing pulsed laser oscillator 13 in response to the output of a sensor which monitors the deflection angle with a high degree of accuracy.

A third embodiment of the invention will now be described with reference to FIG. 13. In the third embodiment, prior to the alignment of a wafer by an alignment optical system, the positional relation between a processing laser projection system and the alignment optical system is measured and the wafer alignment is effected on the basis of the result of the measurement.

Figure 13:
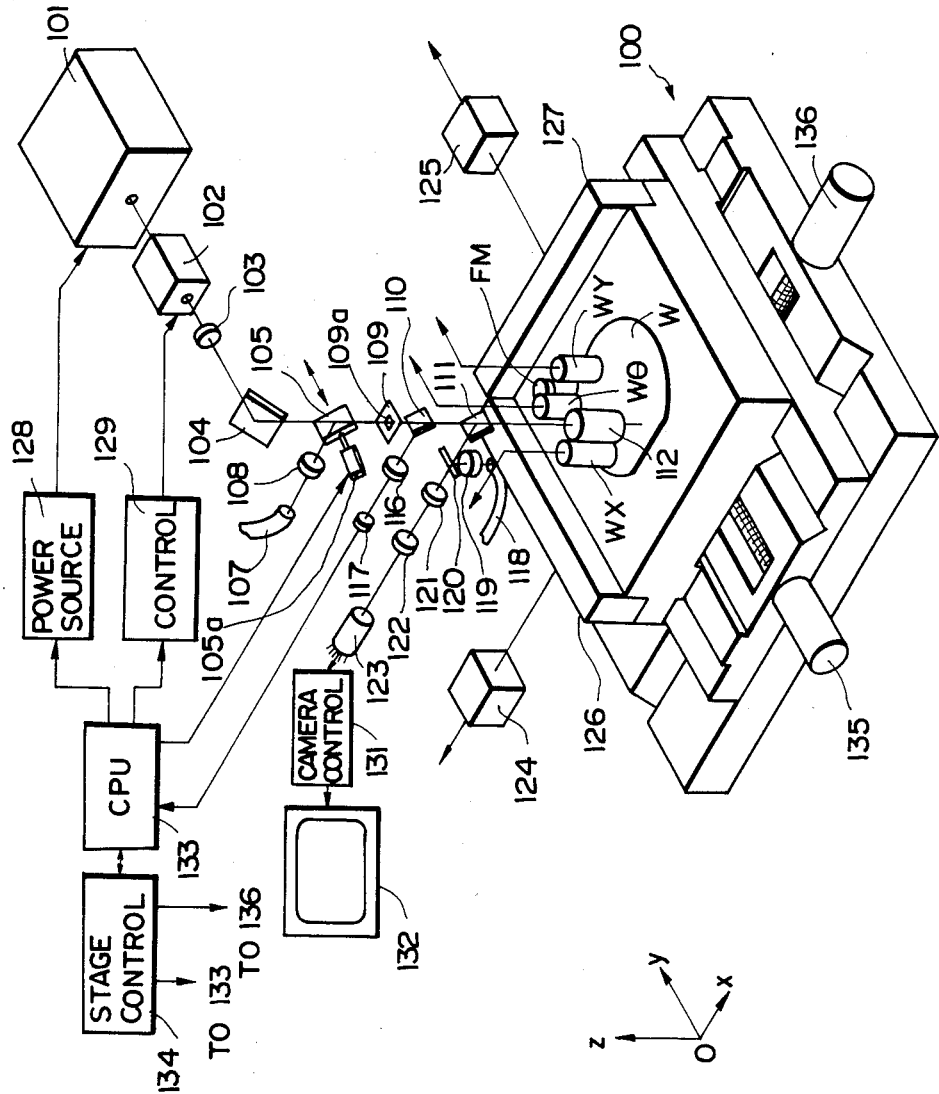
FIG. 13 is a perspective view showing a third embodiment of the invention.

In FIG. 13, a processing laser projection system comprises a source 101 of processing laser beam, e.g., YAG laser beam, a variable attenuator 102, a condenser lens 103, a mirror 104, an aperture plate 109 having an aperture 109a, a beam splitter 110 and an objective lens 112. Also attached to the projection system are a measuring system for measuring the projection position of the processing laser beam and an observation system for observing the laser projection position. The measuring system comprises an illuminating optical fiber 107, a condenser lens 108, a movable mirror 105 movable in the directions of the arrows, a driver 105a for moving the mirror 105, the aperture plate 109, the beam splitter 110, the objective lens 112, a condenser lens 116 and a detector 117. The observation system comprises an illuminating optical fiber 118, a condenser lens 119, a beam splitter 120, a dichroic mirror 111, the objective lens 112, an index reticle 121, a relay lens 122 and an image pickup tube 123. Also, sensors WX, WY and Wθ are provided to serve as global alignment sensors for aligning a wafer W.

The processing laser projection system, the measuring system, the observation system and the global alignment ssensors are integrally incorporated in the laser processing apparatus proper. The sensors WX, WY and Wθ and the objective lens 112 are fixedly mounted in the apparatus proper so that they are in specified positional relations with one another. Fixedly arranged on an XY stage 100 is a fiducial mark FM used in the measurement of the relative positions of the sensors WX, WY and Wθ and the measuring system. The position of the stage 110 is measured by an X-laser interferometer 124 and a Y-laser interferometer 125.

The stage 100 is moved by an X-motor 136 and a Y-motor 135 and these motors are controlled by a stage controller 134. A Z-stage (not shown) is arranged on the stage 100 and a θ-rotation stage (not shown) is arranged on the Z-stage on which is mounted the wafer W. The Z-stage and the θ-rotation stage are moved by motors (not shown) which are controlled by the stage controller 134. A central controller or CPU 133 generates commands for the stage controller 134 and laser emitting and attenuation commands and it also effects the measurement of a laser projection position, etc. Numeral 128 designates a processing laser power source, and 129 designals a controlLer for the variable attenuator 102. A camera control unit 131 and an ITV monitor 132 are adapted to observe in a change-over manner not only the magnified image produced by the objective lens 112 but also the magnified images detected through the global alignment sensors WX, WY and Wθ.

Although not shown, an automatic focussing system and the Z-stage are arranged to effect the focussing such that the surface of the wafer W coincides with the image plane of a reduced projected image of the aperture 109a and it is so arranged that the stage controller 134 maintains the optimum imaging condition, that is, a condition in which the image of the aperture 109a is formed on the wafer W.

Figure 14:
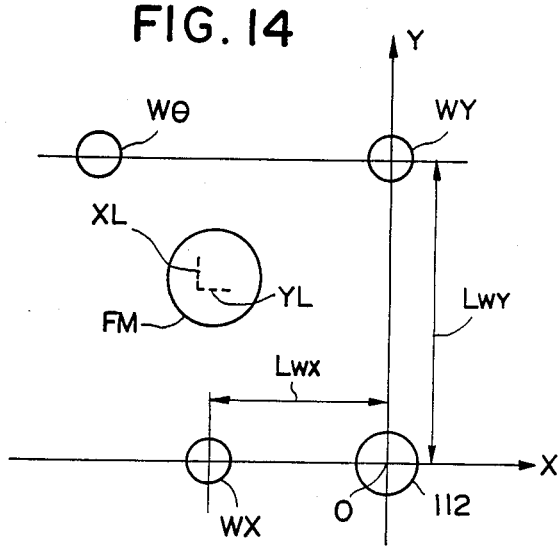
FIG. 14 is a plan view showing the relation between the processing laser projection position and the global alignment system.

FIG. 14 is a plan view showing the relation between a processing laser projection position and the global alignment sensors and the arrangement is the same as that described in detail in U.S. Pat. No. 4,385,838.

The processing laser projection position near the center of the objective lens 112 is selected as an origin 0 and X and Y axes are drawn to cross at right angles at the origin 0. The X and Y axes are the same in direction with the coordinate axes determined by mirrors 127 and 128 of the later interferometers 124 and 125 of FIG. 13. The sensors WX and WY are respectively arranged on the X and Y axes so as to prevent any Abbe error. The sensor W$\theta$ has the same Y-coordinate as the sensor WY and it detects, in cooperation with the sensor WY, a rotation error of the wafer W. The sensors WX and WY are respectively used to detect the position of the wafer W in the X and Y directions. Also, the distance between the origin 0 and the sensor WY and the distance between the origin 0 and the sensor WX are measured by moving the stage 100 such that marks XL and YL on the fiducial mark FM are detected by the sensors WX and WY and the measuring system. The detected values are then determined by the laser interferometers 124 and 125. This operation will be described later in detail.

Figure 15:
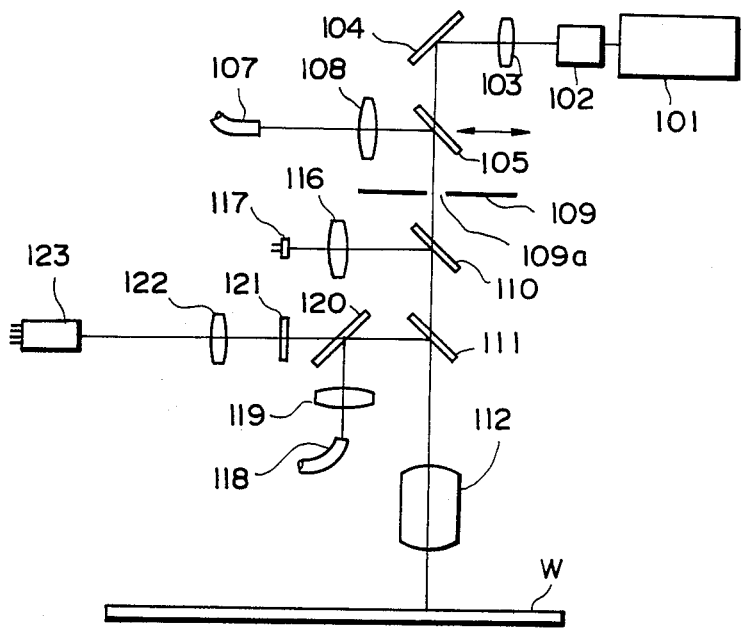
FIG. 15 is a schematic diagram of the principal optical system.

FIG. 15 shows the processing laser projection system, the measuring system and the observation system and shows in detail a part of the apparatus of FIG. 13. The aperture 109a of the aperture plate 109 has a square or rectangular shape and the image of the aperture 109a is reduction projected on the wafer W through the objective lens 112. The measuring system is enabled by moving the movable mirror 105 into the optical path of the laser projection system. When the movable mirror 105 is brought into the broken line position, the light from the optical fiber 107 is projected onto the aperture plate 109 through the condenser lens 108 and the image of the aperture 109a is reduction projected onto the wafer W through the objective lens 112. The projection position is the same as the processing laser- projection position. In other words, the detection center of the measuring system on the stage 100 coincides with the center of the laser projection position of the projection system on the stage 100. When the light image projected by the lens 112 is reflected by the surface of the wafer W or any other reflecting material (e.g., the fiducial mark FM) at the position of the former, a part of the reflected light is reflected by the beam splitter 110, condensed by the condenser lens 116 and detected by the detector 117. Thus, the detector 117 generates a detection signal of the pattern at the projection position. When the measuring system is functioning, no light is produced through the optical fiber 118.

The light emitted for the observation system from the optical guide 118 is projected onto the wafer W through the objective lens 112 so that the image of the pattern on the wafer W is formed on the reticle 121 arranged at the image plane of the objective lens 112. Then, the image is projected on the pickup tube 123 through the relay lens 122.

Figure 16:
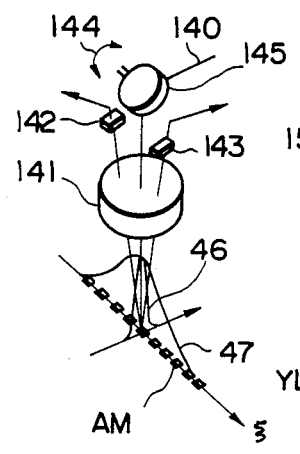
FIG. 16 is a schematic diagram of the global alignment sensors.

FIG. 16 shows the principle of the global alignment sensors WX, WY and W$\theta$ which is described in U.S. Pat. No. 4,423,959. An n axis extends in the direction of alignment error detection. Thus, the axis n corresponds to the X axis for the sensor WX and the n axis corresponds to the direction of the Y axis for the sensors WY and W$\theta$. A laser beam 140 is reflected by a reflecting mirror 145 which oscillates as shown by a double-head arrow 144 and the reflected light is condensed by a lens 141 so as to scan in the direction of the n axis. The condensed beam has an elongated shape in the direction of a $\xi$ axis by the effect of a cylindrical optical system which is not shown. In other words, the condensed beam is shaped to include a plurality of patterns arranged in the direction of the $\xi$ axis to form an alignment mark AM. When the alignment mark AM in the form of a grating is scanned in the n-axis direction by the condensed beam, diffracted light is detected and photoelectrically converted by detectors 142 and 143 arranged in the $\xi$-axis direction and then subjected to synchronous detection in synchronism with the oscillation of the reflecting mirror 145, thereby generating an alignment error signal.

Figure 18:
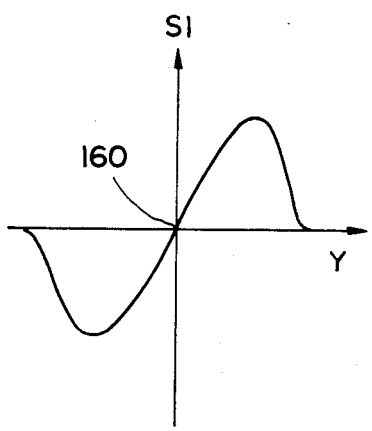
FIG. 18 is a diagram showing an output signal waveform of the global alignment sensor.
Figure 19:
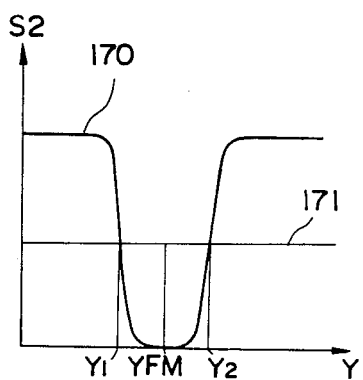
FIG. 19 is a diagram showing an output signal waveform of the measuring system.

FIG. 18 shows the waveform of an alignment error signal S1 generated when the alignment mark AM passes below a sensor X, Y or $\theta$ while the reflecting mirror 145 is oscillating and the alignment mark AM coincides with the detection center of the sensor X, Y or $\theta$ at a zero point 160.

Figure 17:
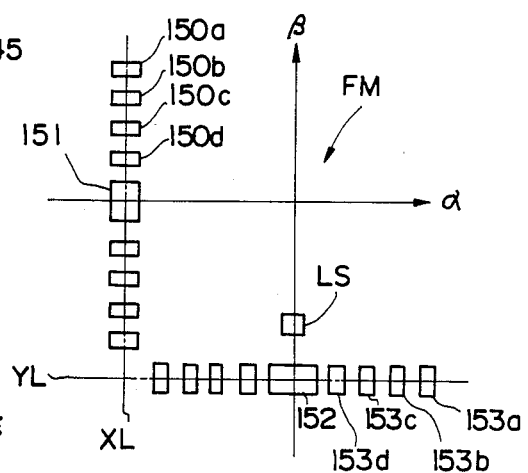
FIG. 17 is a plan view showing the patterns of the fiducial mark.

FIG. 17 shows the form of the fiducial mark FM formed on the XY stage and including a plurality of short rectangles 150a, 150b, . . . arranged at regular intervals along a reference line XL in the Y-axis direction and a long rectangle 151 arranged near the center of the group of the short rectangles and having a length corresponding to one cycle of the short rectangles in continued form. In other words, if $L_1$ represents the length of the $\beta$direction side of each of the short rectangles 150a, 150b, . . . and $L_2$ designates the spacing between the short rectangles, then the $\beta$-direction length of the long rectangle 151 is given as $(2L_1+L_2)$. Similarly, the mark FM includes a plurality of short rectangles 153a, 153b, . . . arranged along a reference line YL in the X-axis direction and a long rectangle 152 and these rectangles are arranged in the same regular order as the rectangles in the Y-axis direction. The row of rectangles formed along the line XL will hereinafter be referred to as an XL pattern and the row of rectangles along the line YL will be referred to as a YL pattern. More particularly, these rectangles are formed by selectively removing the chromium plating applied to the surface of the disc. Thus, these rectangles are lower in reflectance than the surrounding portions.

The mark FM may be detected by the global alignment sensors WY, W$\theta$ and WX and it may also be detected by the measuring system. The light image LS projected on the stage 100 by the measuring system is such that its lengths in the $\alpha$-axis direction (the X-axis direction) and $\beta$-axis direction (the Y-axis direction) are shorter than $(2L_2+L_2)$. When the fiducial mark FM is detected by the sensor WY, W$\theta$ or WY, the resulting output waveform is the same as shown in FIG. 18.

A description will now be made of a case in which the mark FM is detected by the measuring system. When the mark FM is scanned so as to pass below the objective lens 112 in response to the Y-direction movement of the stage 100, the relation between the amount of the Y-direction movement Y and an output signal $S_2$ of the detector 117 becomes as shown by signal 170 in FIG. 9. The Y-direction position represents the value measured by the laser interferometer 125.

The signal 170 is compared with a reference level 171 so that their coincidence positions $Y_1$ and $Y_2$ are determined and a center point $Y_{FM}$ is determined thereby, determining a Y-direction position at which the centers of the light image LS and the pattern 152 coincide. Therefore, in Fig. 14, by moving the fiducial mark FM and photoelectrically detecting it by the sensor WY and the measuring system, it is possible to measure a distance $L_{WY}$ from the origin 0 of the light image LS by the measuring system to the detection center of the sensor WY.

On the other hand, a distance $L_{WX}$ from the origin O to the sensor WC can be similarly measured by using the X-direction pattern of the fiducial mark FM.

The reason for selecting the lengths of the sides of the light image LS shorter than the length $(2L_1+L_2)$ of the rectangles 151 and 152 resides in preventing the light image LS from overlapping the end of the pattern 151 or 52 (the longitudinal end) when the pattern 151 is moved in the $\alpha$-direction with respect to the light image LS or the pattern 152 is moved in the $\beta$-direction with respect to the light image LS.

The distances $L_{WY}$ and $L_{WX}$ are respectively generated from the laser interferometers 125 and 124 and stored in the CPU 133 for use as constants in making the wafer alignment. The distance between the sensors WY and W$\theta$ is a value which is inherent to the apparatus and determined preliminarily and it is stored in the CPU 133.

Figure 20:
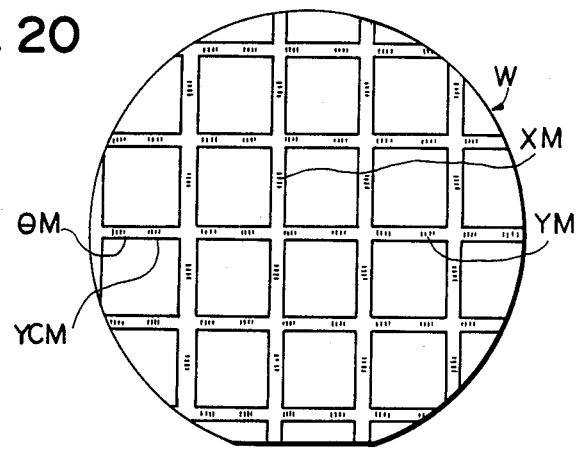
FIG. 20 is a diagram showing the arrangement of the alignment marks on the wafer.

To align the wafer W globally, the stage 100 is moved so that the sensors WY and W$\theta$ respectively detect the marks YM and $\theta$M formed on the wafer W as shown in FIG. 20 and then the $\theta$-rotation stage is rotated, thereby eliminating the rotation error of the wafer W. Then, the Y-direction position of the stage 100 is detected from the output of the interferometer 125 and it is stored in the CPU 133.

It is to be noted that after the elimination of the rotation error, the $\theta$-rotation stage may be fixedly mounted on the stage 100 so that the center position of a $\theta$-check mark YCM is detected by the sensor WY and the remaining rotation error $\epsilon$ of the wafer W with respect to the X and Y coordinate systems is determined.

Then, the stage 100 is moved so that the mark XM on the wafer W is detected by the sensor WX and the X-direction position of the stage 100 is detected from the interferometer 124, thereby storing the stage position in the CPU 133. These operations determine the positional relation of the pattern on the wafer W with respect to the X and Y coordinates of the stage 100 and the global alignment of the wafer W is effected. The details of these operations are disclosed in the previously mentioned U.S. Pat. No. 4,385,838.

Also, where the remaining rotation error $\epsilon$ is detected as mentioned previously, no difficulty will be caused even if the remaining rotation error is great as compared with the rotation alignment error caused during the exposure of the chip pattern. The reason is that the size of the area illuminated by the processing laser is several microns at the most and it is appreciably small as compared with the exposure size of 10 to 20 mm in the exposure apparatus (stepper). In this case, however, the alignment of the processing laser projection point must be effected with the accuracy of submicron order and this requires that the remaining rotation error $\epsilon$ of the wafer be measured so that during the alignment the rotation of the wafer coordinate systems is determined and the center of the processing laser projection position is aligned with the desired position.

With this embodiment, when detecting the mark FM by the sensors WY, W$\theta$ and WX, the stage 100 need not always be stopped and it is only necessary to measure and store the stage coordinate at the detection center of the mark FM by each sensor.

Figure 22:
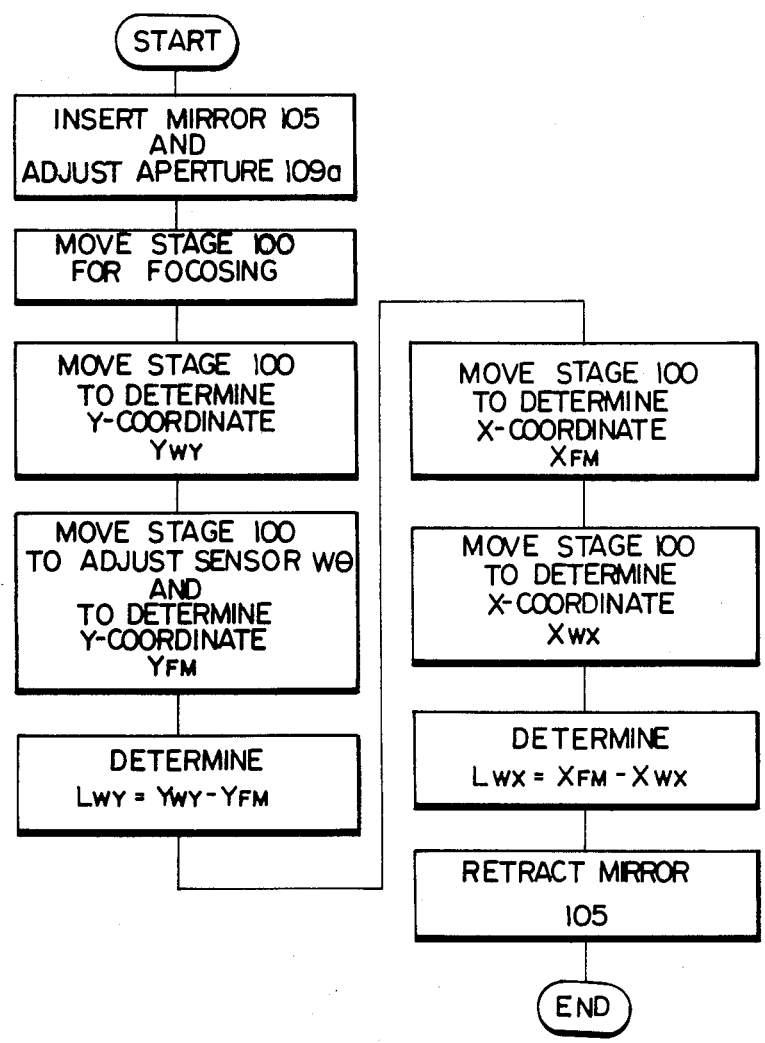
FIGS. 22 and 23 are flow charts showing the operation of the CPU.
Figure 23:
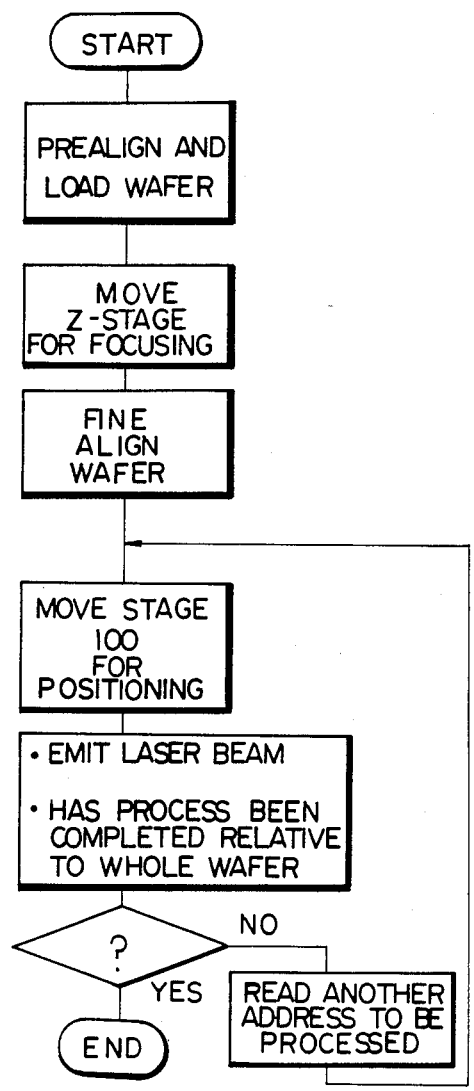

The operation of this embodiment will now be described with reference to the flow charts of FIGS. 22 and 23. The operation of the embodiment prior to the loading of a wafer on the stage 100 will be described first.

The CPU 133 first applies a signal to the mirror driver 105a so that the movable mirror 105 is inserted in the optical path of the laser projection system and simultaneously the size of the aperture 109a is adjusted. Then, the motor (not shown) is operated by the stage controller 134 so that the stage 100 is moved in the Z direction and the desired focussing is effected. Thus, the image of the aperture 109a illuminated by the optical fiber 107 is formed on the stage 100 and the reflected light from this image is focussed on the detector 117. Then, the motors 135 and 136 are operated by the controller 134 so that the stage 100 is moved in the X and Y directions and the YL pattern of the fiducial mark FM is positioned below the sensor WY, thereby detecting the center YL of the YL pattern by the sensor WY. The signals from the detectors 142 and 143 of FIG. 16 are processed in the CPU 133. Then, the Y-coordinate $Y_{WY\ at}$ which the detection center of the sensor WY coincides with the center YL is stored. The position of the stage 100 is determined in accordance with the output of the interferometer 125.

Then, the X-motor 136 is operated by the controller 134 so as to move the stage 100 while maintaining the Y-coordinate $Y_{WY}$. At this time, even if the YL pattern is positioned below the sensor W$\theta$, the detection center of the sensor W$\theta$ does not necessarily coincide with the center YL accurately. Therefore, in accordance with the known method the detection center of the sensor W$\theta$ is shifted to accurately align it with the center YL. Then, the motors 135 and 136 are operated further and the stage 100 is moved to a position where the YL pattern, more particularly the pattern of the rectangle 152, is detected by the measuring system. The stage 100 is scanned in the Y direction so that the reflected light from the YL pattern illuminated by the optical fiber 107 is received by the detector 117 and the center YL is detected. Thus, the Y-coordinate $Y_{FM}$ at which detection center 0 of the measuring system coincides with the center YL is stored.

Then, the CPU 133 subtracts the coordinate $Y_{FM}$ from the coordinate $Y_{WY}$ and stores the resulting difference $L_{WY}$ (FIG. 14).

The stage 100 is then moved to a position where the XL pattern, more particularly the pattern of the rectangle 151, is detected by the measuring system. Then, the stage 100 is moved further in the X direction until the reflected light from the XL pattern is received by the detector 117 so that the center XL of the XL pattern is detected by the measuring system and an X-coordinate $X_{FM}$ at which the detection center 0 of the measuring system coincides with the center XL is stored.

Then, the stage 100 is moved so that the XL pattern is positioned below the sensor WX and the center XL is detected. thereby storing an X-coordinate $X_{WX}$ at which the detection center of the sensor WX coincides with the center XL.

The CPU 133 subtracts the coordinate $X_{WX}$ from the coordinate $X_{FM}$ and stores the resulting value $L_{WX}$ (see FIG. 14).

Then, the movable mirror 105 is retracted from the optical path of the laser projection system. As a result, the distance $L_{WY}$ between the detection center 0 of the measuring system and the detection center of the sensor WY and the distance $L_{WX}$ between the detection center 0 of the measuring system and the sensor WX are determined. The detection center 0 of the measuring system coincides with the center of the processing laser projection position on the stage. Therefore, the value $L_{WY}$ indicates the distance between the center of the laser projection position and the detection center of the sensor WY and the value $L_{WX}$ indicates the distance between the center of the laser projection position and the detection center of the sensor WX.

The remaining operation of the CPU 133 will now be described with reference to the flow chart of FIG. 23. A prealignment of the wafer is effected first by the prealignment mechanism which is not shown. Then, the wafer is loaded on the stage 100 by the loading mechanism which is not shown. The wafer is chucked to the θ-rotation stage on the stage 100. The wafer W shown in FIG. 13 is the one loaded in this way. Then, the automatic focussing detecting system and the Z-stage, which are not shown, are operated to effect the focussing such that the image of the aperture 109a is formed on the wafer.

Then, using the sensors WY and Wθ and the alignment marks YM and θM on the wafer, the wafer loaded on the stage 100 is fine aligned in the Y and θ directions in response to the movement of the stage 100 and the θ-rotation stage. In other words, the Y-alignment mark YM and the θ-alignment mark θM are positioned on a line parallel to the X-axis. Then, the Y-coordinate of the stage 100 providing this condition is stored.

Thereafter, the wafer is fine aligned in the X direction by means of the sensor WX and the alignment mark XM. At this time, the X-coordinate of the stage 100 is stored.

In this way, the CPU 133 effects the fine alignment of the wafer and it also stores the position of the stage 100 by detecting the alignment marks YM, θM and WM at specific positions of the wafer. At this time, the CPU 133 has stored in its memory the data relating to the size of the wafer, the size of the chips, the arrangement of the chips and the working positions in the respective chips, the data relating to the distances to the center 0 of the projection positions of the global alignment sensors WX and WY and the data relating to the position of the wafer fixed on the stage 100.

Then, in accordance with these stored data, the CPU 133 moves the stage 100 so that one of the chips on the wafer is positioned below the lens 112 and a working position in the chip is aligned with the center 0 of the projection position by the processing laser projection system. Then, the variable attenuator 102 is controlled through the controller 129 and the processing laser light source 101 is operated through the power source 128 thereby emitting a laser beam. The CPU 133 determines whether the processing of all the chips in the wafer is completed. If it is not, anothher chip to be processed is read and the stage 100 is moved, thereby processing all the working positions.

In accordance with this embodiment, it is also possible to project a light image LS through the measuring system and simultaneously effect the illumination by the observation optical system, thereby viewing the positions of the wafer pattern and the light image LS.

Figure 21A:
FIGS. 21A and 21B are diagrams each showing the relation between a circuit to be cut and a processing laser projection position.
Figure 21B:
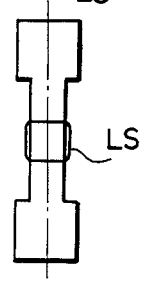

FIGS. 21A and 21B show the light image of the laser beam and the observed image of the pattern when cutting the circuit pattern in one of the chips formed on the wafer, with FIG. 21A showing the pattern extending in the X direction and FIG. 21B showing the pattern extending in the Y direction. The use of the previously mentioned observation optical system has the effect of not only allowing confirmation of the positions of cutting points but also making it possible so that even if a small amount of alignment error is left due to such a cause as a positional drift of the optical system, a runout of the wafer or the like, the stage may be moved minutely while observing through the observation system, thereby accurately cutting the circuit despite the alignment error.

Figure 24:
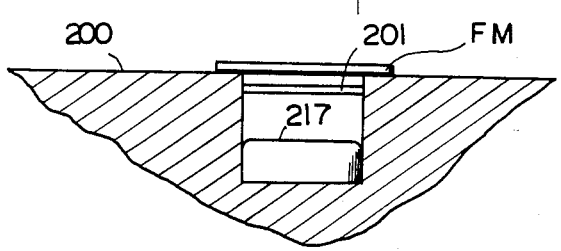
FIG. 24 is a partial sectional view showing a modification of the detector in the observation system.

A modification of the embodiment of FIG. 13 will now be described with reference to FIG. 24. This modification differs from the embodiment of FIG. 13 in that a detector 217 corresponding to the detector 117 of FIG. 13 is positioned below a fiducial mark FM fixedly placed on a stage 200, more particularly within the stage 200. The fiducial mark FM is made of a light transmitting material plated with chrome except for its YL and XL patterns. When the YL pattern or the XL pattern is illuminated with the illuminating light from the optical fiber 107 or the attenuated laser beam from the laser light source 101, the detector 217 receives the light beam passed through the pattern and generates a detection signal.

In this modification, a filter 201 is also arranged between the fiducial mark FM and the detector 217 so as to remove any disturbance light of wavelengths other than the desired light. The construction excluding the detector 217 and the filter 201 and the control procedures of the CPU are the same as those of the embodiment of FIG. 13.

We claim:

1. A processing apparatus, comprising:
   means for supporting a work provided with reference patterns on a surface thereof, said reference patterns representing reference positions on said surface;
   means for generating information relating to positions relative to said reference positions on said work;
   processing means including a detecting optical system for detecting said reference patterns and a beam radiating system for supplying a spot of energy beam for processing said work to focus said spot of energy beam on said work at a position indicated by said information;
   first control means responsive to said information to control said processing means to form on said work dummy marks having characteristic features detectable by said detecting optical system; and
   second control means for measuring positions of said dummy marks relative to said reference positions through said detecting optical system to determine an error existing in said processing means in accordance with differences between said measured positions and said information.

2. An apparatus according to claim 1, wherein the information of said information generating means includes a first information indicating the positions of said dummy marks relative to said reference positions.

3. An apparatus according to claim 2, wherein the information of said information generating means further includes a second information indicating a focusing position of said spot of energy beam on said work, said apparatus further comprising means responsive to the error determined by said second control means to correct said focusing position.

4. An apparatus according to claim 3, wherein said correcting means changes the contents of said second information.

5. An apparatus according to claim 1, further comprising displacing means for producing a relative displacement between said work and said processing means in a direction parallel to said surface whereby said first control means operates said displacing means and said detecting optical system to detect said reference patterns and also actuates said displacing means and said beam radiating means to form said dummy marks at given positions relative to said reference patterns.

6. An apparatus according to claim 1, wherein said beam radiating system comprises light source means for radiating a laser beam, and a condensing optical sysem for condensing said laser beam onto said work.

7. An apparatus according to claim 6, wherein said detecting optical system comprises an objective lens system fixedly arranged relative to said beam radiating system, means for projecting a detecting beam onto said work through said objective lens system, and photoelectric detecting means for receiving said detecting beam reflected from said work.

8. An apparatus according to claim 6, wherein said detecting optical system comprises means for projecting a detecting beam onto said work through said condensing optical system, and photoelectric detecting means for receiving said detecting beam reflected from said work.

9. An apparatus according to claim 1, wherein said dummy marks are substantially the same in shape and size with said reference marks.

10. A processing apparatus, comprising:
means for supporting a work provided on a surface thereof with an actual pattern formed according to a design pattern;
beam radiating means for focusing a spot of energy beam on the surface of said work to partially process said actual pattern;
displacing means for producing a relative displacement between said work and said spot of energy beam to direct said spot to a selected one of a plurality of working positions on said work;
memory means preliminarily recording therein information relating to positional errors of said actual pattern relative to said design pattern; and
means for reading from the information in said memory means a positional error of said actual pattern at said selected working position to correct said selected working position.

11. An apparatus according to claim 10, wherein said memory means preliminarly stores a positional error of said actual pattern for each of a plurality of positions on said work.

12. An apparatus according to claim 11, further comprising means for generating data indicating the working positions on said work, and means for actuating said displacing means in accordance with said data, whereby said correcting means corrects said data in accordance with said information.

13. An apparatus according to claim 12, wherein said actual pattern is formed by a photolithography employing a projection optical system, and wherein said memory means stores information relating to errors of said actual pattern due to a distortion of an image formed by said projection optical system.

14. An apparatus according to claim 12, further comprising means for measuring a positional relation between said work and said spot, and wherein said actuating means actuates said displacing means until said measured positional relation corresponds to said corrected information.

15. A processing apparatus, comprising:
means for supporting a work provided on a surface thereof with an actual pattern formed in accordance with a design pattern and reference mark means indicating a plurality of points arranged at predetermined intervals;
beam radiating means for focusing a spot of energy beam on the surface of said work to partially process said actual pattern;
displacing means for producing a relative displacement between said work and said spot of energy beam to direct said spot to a selected one of a plurality of working positions on said work;
means for actually measuring the distance between said plurality of points on said work to determine a magnification error of said measured distance with respect to a design distance;
means for generating data indicating said selected working position on said work; and
means for correcting said data in accordance with said magnification error.

16. An apparatus according to claim 15, further comprising means for actuating said displacing means in accordance with said corrected data.

17. A processing apparatus, comprising:
means for supporting a work formed with a pattern on a surface thereof on a plane;
a beam radiating optical system for projecting a spot of energy beam for partially processing said pattern onto the surface of said work;
reference mark means fixedly arranged on said supporting means;
an alignment optical system including sensor means for detecting said reference mark means;
each of said beam radiating optical system and said alignment optical system having an optical axis such that said optical axis are separated from each other by a predetermined distance; and
means for measuring a relative positional relation between said beam radiating optical system and said alignment optical system.

18. An apparatus according to claim 17, wherein said beam radiating optical system comprises a source of beam supply, an objective lens, and a member having an aperture and arranged between said source of beam supply and said objective lens whereby said objective lens forms an image of said aperture on the surface of said work.

19. An apparatus according to claim 17, wherein said beam radiating optical system comprises an objective lens, and wherein said relative position measuring means includes a detecting optical system having photosensitive surface means arranged conjugate to the surface of said work with respect to said objective lens.

20. An apparatus according to claim 19, wherein said relative position measuring means includes means for moving said supporting means in such a manner that said reference mark means is successively opposed to the optical axis of said alignment optical system and the axis of said objective lens.

21. An apparatus according to claim 21, wherein said alignment optical system includes means for projecting a beam elongated in one direction on said plane onto said reference mark means, said detecting optical system includes means for projecting a light spot of substantially the same size as said spot of energy beam onto said reference mark means, and said reference mark means includes a grating mark having a plurality of grating elements arranged at a predetermined pitch in a direction parallel to said one direction, one of said grating elements which is arranged substantially centrally in said grating mark being formed to be sufficiently long as compared with said light spot in the direction of arrangement of said grating elements.

22. A processing apparatus, comprising:
   means for supporting a work formed with a pattern on a surface means thereof on a plane;
   means for radiating a spot of energy beam for partially processing said pattern toward the surface of said work, said radiating means comprising a source of beam supply having an aperture for radiating said beam therethrough, and an objective lens system for forming an image of said aperture on the surface of said work; and
   means for detecting said pattern through said objective lens system, said detecting means comprising means for supplying between said source of beam supply and said objective lens system an illuminating beam directed to travel along the optical axis of said objective lens system to illuminate said pattern through said objective lens system, and means for receiving light scattered from said pattern.

23. An apparatus according to claim 22, wherein said light receiving means is arranged to receive said scattered light passed through said objective lens system.

* * * * *